(12) United States Patent
Takahashi et al.

(10) Patent No.: US 10,974,324 B2
(45) Date of Patent: Apr. 13, 2021

(54) COATED CUTTING TOOL

(71) Applicant: TUNGALOY CORPORATION, Fukushima (JP)

(72) Inventors: Kinya Takahashi, Iwaki (JP); Naoyuki Fukushima, Iwaki (JP)

(73) Assignee: TUNGALOY CORPORATION, Iwaki (JP)

( * ) Notice: Subject to any disclaimer, the term of this patent is extended or adjusted under 35 U.S.C. 154(b) by 113 days.

(21) Appl. No.: 16/185,143

(22) Filed: Nov. 9, 2018

(65) Prior Publication Data

US 2019/0160547 A1 May 30, 2019

(30) Foreign Application Priority Data

Nov. 29, 2017 (JP) .............................. JP2017-229127

(51) Int. Cl.
 *B32B 27/14* (2006.01)
 *B23B 27/14* (2006.01)
 (Continued)

(52) U.S. Cl.
 CPC ........ *B23B 27/148* (2013.01); *C23C 16/0272* (2013.01); *C23C 16/32* (2013.01);
 (Continued)

(58) Field of Classification Search
 CPC ......... B23B 27/14; C23C 16/32; C23C 16/34; C23C 16/36; C23C 16/403
 (Continued)

(56) References Cited

U.S. PATENT DOCUMENTS 5,871,850 A 2/1999 Moriguchi et al.
7,820,310 B2 10/2010 Björmander
(Continued)

FOREIGN PATENT DOCUMENTS

EP 1905870 A2 4/2008
EP 3000913 A1 3/2016
(Continued)

OTHER PUBLICATIONS

Sakari Ruppi, "Enhanced Performance of a-Al2O3 Coatings by Control of Crystal Orientation," Surface & Coatings Technology, May 2008, pp. 4257-4269, Elsevier.
(Continued)

*Primary Examiner* — Archene A Turner
(74) *Attorney, Agent, or Firm* — Studebaker & Brackett PC

(57) ABSTRACT

A coated cutting tool comprising a substrate and a coating layer formed on a surface of the substrate, wherein: the coating layer comprises a lower layer including at least one Ti compound layer containing a specific Ti compound, an intermediate layer including an α-type $Al_2O_3$ layer containing α-type $Al_2O_3$, and an upper layer including a TiCN layer containing TiCN; the respective layers are laminated in this order from the substrate side toward a surface side of the coating layer; an average thickness of the coating layer is from 5.0 μm or more to 30.0 μm or less; and an angle formed by a normal to a cross-sectional surface which is located within a predetermined range below a surface of the intermediate layer and is parallel to the surface of the substrate and a normal to a (001) plane of a particle of an α-type $Al_2O_3$ layer, and an angle formed by a normal to a cross-sectional surface which is located within a predetermined range below a surface of the upper layer and is parallel to the surface of the substrate and a normal to a (111) plane of a
(Continued)

particle of a TiCN layer, respectively satisfy predetermined conditions.

20 Claims, 1 Drawing Sheet

(51) Int. Cl.
<table>
<tr><td>C23C 16/34</td><td>(2006.01)</td></tr>
<tr><td>C23C 16/32</td><td>(2006.01)</td></tr>
<tr><td>C23C 16/40</td><td>(2006.01)</td></tr>
<tr><td>C23C 16/36</td><td>(2006.01)</td></tr>
<tr><td>C23C 16/56</td><td>(2006.01)</td></tr>
<tr><td>C23C 28/04</td><td>(2006.01)</td></tr>
<tr><td>C23C 16/02</td><td>(2006.01)</td></tr>
</table>

(52) U.S. Cl.
CPC .............. *C23C 16/34* (2013.01); *C23C 16/36* (2013.01); *C23C 16/403* (2013.01); *C23C 16/56* (2013.01); *C23C 28/042* (2013.01); *C23C 28/044* (2013.01); *B23B 2224/04* (2013.01); *B23B 2224/32* (2013.01); *B23B 2224/36* (2013.01); *B23B 2228/04* (2013.01); *B23B 2228/10* (2013.01); *B23B 2228/36* (2013.01)

(58) Field of Classification Search
USPC .......... 51/307, 309; 428/212, 336, 698, 701, 428/702
See application file for complete search history.

(56) References Cited

U.S. PATENT DOCUMENTS

<table>
<tr><td>2003/0211366 A1</td><td>11/2003</td><td>Ruppi et al.</td></tr>
<tr><td>2005/0042482 A1</td><td>2/2005</td><td>Okada et al.</td></tr>
<tr><td>2007/0104945 A1</td><td>5/2007</td><td>Ruppi</td></tr>
<tr><td>2014/0193624 A1</td><td>7/2014</td><td>Stiens et al.</td></tr>
<tr><td>2014/0377024 A1</td><td>12/2014</td><td>Sobana et al.</td></tr>
<tr><td>2017/0008092 A1</td><td>1/2017</td><td>Ruppi et al.</td></tr>
<tr><td>2017/0190591 A1</td><td>7/2017</td><td>Imamura et al.</td></tr>
<tr><td>2017/0275765 A1</td><td>9/2017</td><td>Stiens et al.</td></tr>
</table>

FOREIGN PATENT DOCUMENTS

<table>
<tr><td>JP</td><td>H04-103754 A</td><td></td><td>4/1992</td></tr>
<tr><td>JP</td><td>H08-90310 A</td><td></td><td>4/1996</td></tr>
<tr><td>JP</td><td>H08-158052 A</td><td></td><td>6/1996</td></tr>
<tr><td>JP</td><td>2003-311510 A</td><td></td><td>11/2003</td></tr>
<tr><td>JP</td><td>2005205586 A</td><td></td><td>8/2005</td></tr>
<tr><td>JP</td><td>2007-125686 A</td><td></td><td>5/2007</td></tr>
<tr><td>JP</td><td>2007-260851 A</td><td></td><td>10/2007</td></tr>
<tr><td>JP</td><td>2009-056538</td><td>*</td><td>3/2009</td></tr>
<tr><td>JP</td><td>2012-196726 A</td><td></td><td>10/2012</td></tr>
<tr><td>JP</td><td>2013-132717 A</td><td></td><td>7/2013</td></tr>
<tr><td>JP</td><td>2014-530112 A</td><td></td><td>11/2014</td></tr>
<tr><td>JP</td><td>2015-085441 A</td><td></td><td>5/2015</td></tr>
<tr><td>JP</td><td>2017-506163 A</td><td></td><td>3/2017</td></tr>
<tr><td>JP</td><td>2017-530019 A</td><td></td><td>10/2017</td></tr>
<tr><td>WO</td><td>2015/005364 A1</td><td></td><td>1/2015</td></tr>
<tr><td>WO</td><td>2015/114049 A1</td><td></td><td>8/2015</td></tr>
<tr><td>WO</td><td>2016/045937 A1</td><td></td><td>3/2016</td></tr>
<tr><td>WO</td><td>2017/037796 A1</td><td></td><td>3/2017</td></tr>
</table>

OTHER PUBLICATIONS

A Third Party Observation mailed by the European Patent Office dated Jan. 22, 2021, which corresponds to European Patent Application No. 20180205278 and is related to U.S. Appl. No. 16/185,143.

* cited by examiner

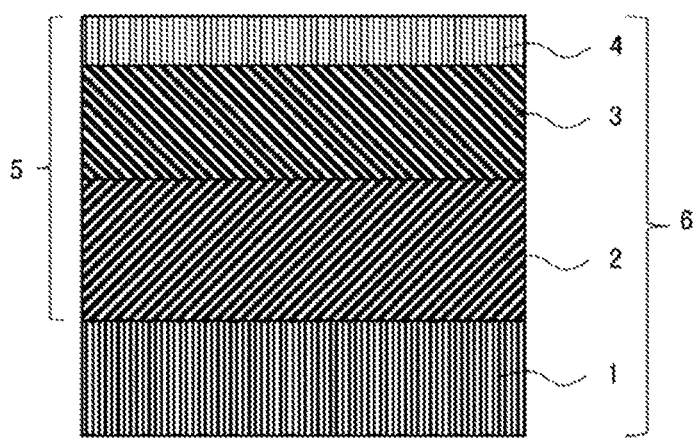

COATED CUTTING TOOL

TECHNICAL FIELD

The present invention relates to a coated cutting tool.

BACKGROUND ART

It has been conventionally well known to employ, for the cutting of steel, cast iron, etc., a coated cutting tool which is obtained by depositing, via chemical vapor deposition, a coating layer with a total thickness of from 3 µm or more to 20 µm or less on a surface of a substrate consisting of a cemented carbide. A known example of the above coating layer is a coating layer consisting of a single layer of one kind selected from the group consisting of a Ti carbide, a Ti nitride, a Ti carbonitride, a Ti carboxide, a Ti carboxynitride, and aluminum oxide ($Al_2O_3$), or consisting of multiple layers of two or more kinds selected therefrom.

JP2013-132717 A discloses a surface-coated cutting tool which is obtained by depositing a lower layer consisting of a titanium compound layer and an upper layer consisting of an aluminum oxide layer ($Al_2O_3$ layer), such layers together constituting a hard coating layer, on a surface of a tool substrate formed of a tungsten carbide-based cemented carbide, wherein, in the upper layer consisting of the aluminum oxide layer ($Al_2O_3$ layer), a (006) plane texture coefficient TC(006) is 1.8 or more, and a ratio I(104)/I(110) of a peak intensity I(104) of a (104) plane to a peak intensity I(110) of a (110) plane ranges from 0.5 to 2.0, and wherein an absolute value of a residual stress value in the aluminum oxide layer ($Al_2O_3$ layer) is 100 MPa or less.

SUMMARY

Technical Problem

An increase in speed, feed and depth of cut have become more conspicuous in cutting in recent times, and the wear resistance of a tool and the fracture resistance thereof are required to be further improved compared to those involved in the prior art. In particular, in recent times, there has been a growth in cutting which places a load on a coated cutting tool, such as high-speed cutting of steel, and under such severe cutting conditions, a conventional cutting tool is likely to involve the occurrence of crater wear and fracturing due to the falling of particles from a coating layer of such cutting tool. This triggers a problem in that the tool life cannot be extended.

The present invention has been made in order to solve the above-described problem, and an object of the present invention is to provide a coated cutting tool which has excellent wear resistance and fracture resistance and which accordingly allows for an extended tool life.

Solution to Problem

The present inventor has conducted studies regarding extending the tool life of a coated cutting tool from the above-described perspective and has then found that the following configurations, including configurations in which: an α-type $Al_2O_3$ layer and a TiCN layer are laminated in this order; in a predetermined region of each of the α-type $Al_2O_3$ layer and the TiCN layer, a ratio of particles, each of which indicates a predetermined crystal orientation, has a specific value or more; and an average thickness of a coating layer falls within a predetermined range, allow the falling of particles to be suppressed and accordingly allow both the wear resistance and the fracture resistance to be improved, and has further found that, as a result, the tool life of the coated cutting tool can be extended, and this has led to the completion of the present invention.

Namely, the present invention is as set forth below:

(1) A coated cutting tool comprising a substrate and a coating layer formed on a surface of the substrate, wherein:

the coating layer comprises a lower layer including at least one Ti compound layer containing a Ti compound of Ti and an element of at least one kind selected from the group consisting of C, N, O and B, an intermediate layer including an α-type $Al_2O_3$ layer containing α-type $Al_2O_3$, and an upper layer including a TiCN layer containing TiCN;

the respective layers are laminated in this order from the substrate side toward a surface side of the coating layer;

an average thickness of the coating layer is from 5.0 µm or more to 30.0 µm or less;

as to a cross-sectional surface which is located within 1 µm below a surface of the intermediate layer toward the substrate and is parallel to the surface of the substrate, a misorientation A satisfies a condition represented by formula (1) below; and as to a cross-sectional surface which is located within 1 µm below a surface of the upper layer toward the substrate and is parallel to the surface of the substrate, a misorientation B satisfies a condition represented by formula (2) below.

$$RSA \geq 40 \quad (1)$$

(In the formula, RSA refers to a ratio (unit: area %) of the cross-sectional areas of particles, each of which has a misorientation A ranging from 0 degrees or more to below 10 degrees, to the cross-sectional areas of particles, each of which has a misorientation A ranging from 0 degrees or more to 45 degrees or less; and the misorientation A refers to an angle (unit: degrees) formed by a normal to the cross-sectional surface and a normal to a (001) plane of a particle of the α-type $Al_2O_3$ layer in the intermediate layer.)

$$RSB \geq 40 \quad (2)$$

(In the formula, RSB refers to a ratio (unit: area %) of the cross-sectional areas of particles, each of which has a misorientation B ranging from 0 degrees or more to below 10 degrees, to the cross-sectional areas of particles, each of which has a misorientation B ranging from 0 degrees or more to 45 degrees or less; and the misorientation B refers to an angle (unit: degrees) formed by a normal to the cross-sectional surface and a normal to a (111) plane of a particle of the TiCN layer in the upper layer.)

(2) The coated cutting tool according to (1), wherein the RSA is 50 area % or more.

(3) The coated cutting tool according to (1) or (2), wherein the RSB is 50 area % or more.

(4) The coated cutting tool according to any of (1) to (3), wherein an average thickness of the upper layer is from 1.0 µm or more to 6.0 µm or less.

(5) The coated cutting tool according to any of (1) to (4), wherein an average thickness of the intermediate layer is from 3.0 µm or more to 15.0 µm or less.

(6) The coated cutting tool according to any of (1) to (5), wherein an average thickness of the lower layer is from 3.0 µm or more to 15.0 µm or less.

(7) The coated cutting tool according to any of (1) to (6), wherein the lower layer comprises a layer of at least one kind selected from the group consisting of a TiN layer containing TiN, a TiC layer containing TiC, a TiCN layer containing TiCN, a TiCNO layer containing TiCNO, a TiON layer containing TiON and a TiB$_2$ layer containing TiB$_2$.

(8) The coated cutting tool according to any of (1) to (7), wherein the substrate is a cemented carbide, cermet, ceramic or a cubic boron nitride sintered body.

The present invention has been made in order to solve the above-described problems and therefore can provide a coated cutting tool which has excellent wear resistance and fracture resistance and which accordingly allows for an extended tool life.

BRIEF DESCRIPTION OF DRAWINGS

The FIGURE is a schematic cross-sectional view showing an example of a coated cutting tool according to the present invention.

DESCRIPTION OF EMBODIMENTS

An embodiment for carrying out the present invention (hereinafter simply referred to as the "present embodiment") will hereinafter be described in detail, with reference to the attached drawings as appropriate. However, the present invention is not limited to the present embodiment below. Various modifications may be made to the present invention without departing from the gist of the invention. In the drawings, unless otherwise specified, positional relationships, such as vertical and horizontal relationships, are based on the positional relationships shown in the drawings. Further, the dimensional ratios of the drawings are not limited to those shown therein.

A coated cutting tool according to the present embodiment is a coated cutting tool comprising a substrate and a coating layer formed on a surface of the substrate, wherein:

the coating layer comprises a lower layer including at least one Ti compound layer containing a Ti compound of Ti and an element of at least one kind selected from the group consisting of C, N, O and B, an intermediate layer including an α-type Al$_2$O$_3$ layer containing α-type Al$_2$O$_3$, and an upper layer including a TiCN layer containing TiCN;

the respective layers are laminated in this order from the substrate side toward a surface side of the coating layer;

an average thickness of the coating layer is from 5.0 µm or more to 30.0 µm or less;

as to a cross-sectional surface which is located within 1 µm below a surface of the intermediate layer toward the substrate and is parallel to the surface of the substrate, a misorientation A satisfies a condition represented by formula (1) below; and as to a cross-sectional surface which is located within 1 µm below a surface of the upper layer toward the substrate and is parallel to the surface of the substrate, a misorientation B satisfies a condition represented by formula (2) below;

$$RSA \geq 40 \quad (1)$$

(In the formula, RSA refers, in relation to a cross-sectional surface which is parallel to the surface of the substrate, to a ratio (unit: area %) of the cross-sectional areas of particles, each of which has a misorientation A ranging from 0 degrees or more to below 10 degrees, to the cross-sectional areas of particles, each of which has a misorientation A ranging from 0 degrees or more to 45 degrees or less; and the misorientation A refers to an angle (unit: degrees) formed by a normal to the cross-sectional surface and a normal to a (001) plane of a particle of the α-type Al$_2$O$_3$ layer in the intermediate layer)

$$RSB \geq 40 \quad (2)$$

(In the formula, RSB refers, in relation to a cross-sectional surface which is parallel to the surface of the substrate, to a ratio (unit: area %) of the cross-sectional areas of particles, each of which has a misorientation B ranging from 0 degrees or more to below 10 degrees, to the cross-sectional areas of particles, each of which has a misorientation B ranging from 0 degrees or more to 45 degrees or less; and the misorientation B refers to an angle (unit: degrees) formed by a normal to the cross-sectional surface and a normal to a (111) plane of a particle of the TiCN layer in the upper layer.)

The coated cutting tool of the present embodiment comprises the above-described configurations, and this allows the wear resistance and fracture resistance of the coated cutting tool to be improved; as a result, the tool life thereof can be extended. The factors for the improvements in wear resistance and fracture resistance of the coated cutting tool of the present embodiment can be considered to be set forth as follows. However, the present invention is not in any way limited by the factors set forth below. That is, firstly, in the coated cutting tool of the present embodiment, the average thickness of the coating layer is 5.0 µm or more, and this leads to an improvement of wear resistance, and the average thickness of the coating layer is 30.0 µm or less, and this leads to an improvement in the adhesion of the coating layer with respect to the substrate and an improvement of fracture resistance. The intermediate layer of the coating layer used in the present embodiment includes an α-type Al$_2$O$_3$ layer, and the α-type Al$_2$O$_3$ layer has preferential orientation of a (001) plane. The coated cutting tool of the present embodiment has excellent resistance when it includes the above-described α-type Al$_2$O$_3$ layer having preferential orientation of a (001) plane, and this serves as a major factor for excellent crater wear resistance, thereby leading to excellent wear resistance. However, since an intermediate layer including an α-type Al$_2$O$_3$ layer having preferential orientation of a (001) plane is inferior in terms of adhesion, this invites a problem in that the falling of particles occurs under cutting conditions which place a load on the coated cutting tool. In this respect, the coated cutting tool of the present embodiment comprises an upper layer including a TiCN layer having preferential orientation of a (111) plane on the surface of the intermediate layer including the α-type Al$_2$O$_3$ layer, and this serves as a major factor for suppressing the falling of particles of the α-type Al$_2$O$_3$ layer, thereby resulting in improvements of wear resistance and fracture resistance. Further, in the coated cutting tool of the present embodiment, the RAS has a specific value or more which increases the heat resistance of the α-type Al$_2$O$_3$ layer, and this serves as a major factor for improving crater wear resistance, thereby resulting in an improvement of wear resistance. Moreover, in the coated cutting tool of the present embodiment, the RSB has a specific value or more which achieves satisfactory adhesion between the TiCN layer and the α-type Al$_2$O$_3$ layer, and this serves as a major factor for suppressing the falling of particles of the α-type Al$_2$O$_3$ layer, thereby resulting in improvements of wear resistance and fracture resistance. It can be considered that, with a combination of the above-described configurations, the coated cutting tool of the present embodiment achieves improvements of wear resistance and fracture resistance, whereby the tool life can be extended.

The FIGURE is a schematic cross-sectional view showing an example of a coated cutting tool according to the present embodiment. A coated cutting tool 6 is provided with a substrate 1 and a coating layer 5 on a surface of the substrate 1, and a lower layer 2, an intermediate layer 3 and an upper layer 4 are laminated in this order in an upward direction in the coating layer 5.

A coated cutting tool according to the present embodiment comprises a substrate and a coating layer formed on a surface of the substrate. Specific examples of types of the coated cutting tool include an indexable cutting insert for milling or turning, a drill and an end mill.

The substrate used in the present embodiment is not particularly limited, as long as it may be used as a substrate for a coated cutting tool. Examples of such substrate include a cemented carbide, cermet, ceramic, a cubic boron nitride sintered body, a diamond sintered body and high-speed steel. From among the above examples, the substrate is preferably comprised of a cemented carbide, cermet, ceramic or a cubic boron nitride sintered body as this provides further excellent wear resistance and fracture resistance, and, from the same perspective, the substrate is more preferably comprised of a cemented carbide.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The operation and effects of the present invention are still provided even if the substrate surface has been modified in this way.

As to the coating layer used in the present embodiment, the average thickness thereof is from 5.0 μm or more to 30.0 μm or less. In the coated cutting tool of the present embodiment, if the average thickness of the coating layer is 5.0 μm or more, this leads to an improvement of wear resistance, and if the average thickness of the coating layer is 30.0 μm or less, this leads to an improvement in the adhesion of the coating layer with respect to the substrate and an improvement of fracture resistance. From the same perspective, the average thickness of the coating layer is more preferably from 8.0 μm or more to 27.0 μm or less, and is further preferably from 10.0 μm or more to 25.0 μm or less. It should be noted that, as to the average thickness of each layer and the average thickness of the entire coating layer in the coated cutting tool of the present embodiment, each of such average thicknesses can be obtained by: measuring the thickness of each layer or the thickness of the entire coating layer from each of the cross-sectional surfaces at three or more locations in each layer or in the entire coating layer; and calculating the arithmetic mean of the resulting measurements.

[Lower Layer]

The lower layer used in the present embodiment includes at least one Ti compound layer containing a Ti compound of Ti and an element of at least one kind selected from the group consisting of C, N, O and B. If a coated cutting tool comprises a lower layer between a substrate and an intermediate layer containing α-type aluminum oxide (α-type $Al_2O_3$), this leads to improvements of wear resistance and adhesion.

Examples of the Ti compound layer include a TiC layer containing TiC, a TiN layer containing TiN, a TiCN layer containing TiCN, a TiCO layer containing TiCO, a TiCNO layer containing TiCNO, a TiON layer containing TiON and a $TiB_2$ layer containing $TiB_2$.

The lower layer may be constituted by a single layer or multiple layers (for example, two or three layers). However, the lower layer is preferably constituted by multiple layers, is more preferably constituted by two or three layers, and is further preferably constituted by three layers. The lower layer, from the perspective of further improving wear resistance and adhesion, preferably comprises a layer of at least one kind selected from the group consisting of a TiN layer, a TiC layer, a TiCN layer, a TiCNO layer, a TiON layer and a $TiB_2$ layer, and at least one layer of the lower layer is preferably a TiCN layer because this leads to a further improvement of wear resistance. When the lower layer is constituted by three layers: a TiC layer or a TiN layer, serving as a first layer, may be formed on a surface of a substrate; a TiCN layer, serving as a second layer, may be formed on a surface of the first layer; and a TiCNO layer or a TiCO layer, serving as a third layer, may be formed on a surface of the second layer. In particular, as to the lower layer: a TiN layer, serving as a first layer, may be formed on a surface of a substrate; a TiCN layer, serving as a second layer, may be formed on a surface of the first layer; and a TiCNO layer, serving as a third layer, may be formed on a surface of the second layer.

The average thickness of the lower layer used in the present embodiment is preferably from 3.0 μm or more to 15.0 μm or less. In the coated cutting tool of the present embodiment, if the average thickness of the lower layer is 3.0 μm or more, this leads to an improvement of wear resistance. Meanwhile, in the coated cutting tool of the present embodiment, if the average thickness of the lower layer is 15.0 μm or less, the peeling of the coating layer is suppressed, and this mainly serves as a factor for improving fracture resistance. From the same perspective, the average thickness of the lower layer is more preferably from 3.5 μm or more to 13.0 μm or less, is further preferably from 4.0 μm or more to 12.0 μm or less, and is particularly preferably from 4.5 μm or more to 11.0 μm or less.

The average thickness of the TiC layer or the TiN layer, from the perspective of further improving wear resistance and fracture resistance, is preferably from 0.05 μm or more to 1.0 μm or less. From the same perspective, the average thickness of the TiC layer or the TiN layer is more preferably from 0.10 μm or more to 0.5 μm or less, and is further preferably from 0.15 μm or more to 0.3 μm or less.

The average thickness of the TiCN layer, from the perspective of further improving wear resistance and fracture resistance, is preferably from 2.0 μm or more to 20.0 μm or less. From the same perspective, the average thickness of the TiCN layer is more preferably from 2.5 μm or more to 15.0 μm or less, and is further preferably from 3.0 μm or more to 12.0 μm or less.

The average thickness of the TiCNO layer or the TiCO layer, from the perspective of further improving wear resistance and fracture resistance, is preferably from 0.1 μm or more to 1.0 μm or less. From the same perspective, the average thickness of the TiCNO layer or the TiCO layer is more preferably from 0.2 μm or more to 0.5 μm or less.

The Ti compound layer is a layer containing a Ti compound of Ti and an element of at least one kind selected from the group consisting of C, N, O and B. However, such Ti compound layer may contain a very small amount of components other than the above elements, as long as it provides the operation and effects of the lower layer.

[Intermediate Layer]

The intermediate layer used in the present embodiment includes an α-type $Al_2O_3$ layer containing α-type $Al_2O_3$. In the intermediate layer used in the present embodiment, as to a cross-sectional surface which is located within 1 μm below a surface of the intermediate layer toward the substrate and is parallel to a surface of the substrate, a misorientation A satisfies a condition represented by formula (1) below.

$$RSA \geq 40 \quad (1)$$

(In the formula, RSA refers to a ratio (unit: area %) of the cross-sectional areas of particles, each of which has a misorientation A ranging from 0 degrees or more to below 10 degrees, to the cross-sectional areas of particles, each of which has a misorientation A ranging from 0 degrees or more to 45 degrees or less; and the misorientation A refers to an angle (unit: degrees) formed by a normal to the cross-sectional surface and a normal to a (001) plane of a particle of the α-type $Al_2O_3$ layer in the intermediate layer.)

In the coated cutting tool of the present embodiment, the RSA is 40 area % or more, and this provides excellent crater wear resistance, thereby leading to an improvement of wear resistance. From the same perspective, the RSA is preferably 50 area % or more (for example, from 50 area % or more to 80 area % or less), and is more preferably 60 area % or more.

RSA can be obtained by the method set forth below. As to a cross-sectional surface which is located within 1 μm below a surface of an intermediate layer toward a substrate and is parallel to a surface of the substrate, a total ($RSA_{Total}$) of the cross-sectional areas of particles, each of which has a misorientation A ranging from 0 degrees or more to 45 degrees or less, being an angle formed by a normal to the cross-sectional surface and a normal to a (001) plane of a particle of an α-type $Al_2O_3$ layer in the intermediate layer, is defined as constituting 100 area %. Under such assumption, a ratio (area %) of a total of the cross-sectional areas of particles, each of which has a misorientation A ranging from 0 degrees or more to below 10 degrees, to $RSA_{Total}$ may be obtained, and the resulting ratio may be defined as RSA. When obtaining RSA (area %), the cross-sectional area of each particle can be measured using, for example, an electron backscatter diffraction pattern apparatus (EBSD) attached to a scanning electron microscope (SEM), a field emission scanning electron microscope (FE-SEM) or the like. With an EBSD, the crystal orientation of each crystal from among the particles is determined, and the cross-sectional area of the particle with the determined crystal orientation is classified into one of the divisions in, for example, respective 5-degree pitches, and the cross-sectional areas of the particles for each division are obtained. Thereafter, for instance, a total of the cross-sectional areas of particles is obtained for the following divisions: a division with a misorientation ranging from 0 degrees or more to below 10 degrees; a division with a misorientation ranging from 10 degrees or more to below 20 degrees; a division with a misorientation ranging from 20 degrees or more to below 30 degrees; and a division with a misorientation ranging from 30 degrees or more to 45 degrees or less. In this case, a total of the cross-sectional areas of particles, each of which has a misorientation ranging from 0 degrees or more to 45 degrees or less constitutes 100 area %. A ratio of the cross-sectional areas of particles for each of the above divisions to the $RSA_{Total}$ (100 area %) may be obtained, and the resulting ratio may be defined as RSA. It should be noted that the condition represented by formula (1) above is not necessarily required to be satisfied throughout the region located within 1 μm below the surface of the intermediate layer toward the substrate, and such condition is only required to be satisfied with respect to any cross-sectional surface located within the above range.

More specifically, RSA can be obtained by the following method.

Firstly, a sample is set on an FE-SEM. The sample is then irradiated with an electron beam at an angle of incidence of 70 degrees as well as at an acceleration voltage of 15 kV and an irradiation current of 1.0 nA. As to a measurement range of 30 μm×50 μm, it is desirable to obtain a misorientation of a cross-sectional surface for each of the particles present in such range under the EBSD setting of a step size of 0.1 μm.

The average thickness of the α-type $Al_2O_3$ layer used in the present embodiment is preferably from 3.0 μm or more to 15.0 μm or less. If the average thickness of the α-type $Al_2O_3$ layer is 3.0 μm or more, this indicates the tendency of the crater wear resistance in the rake surface of the coated cutting tool to be further improved, and, if such average thickness is 15.0 μm or less, this indicates the tendency of the fracture resistance of the coated cutting tool to be further improved as the peeling of the coating layer is further suppressed. From the same perspective, the average thickness of the α-type $Al_2O_3$ layer is more preferably from 1.5 μm or more to 12.0 μm or less, is further preferably from 3.5 μm or more to 12.0 μm or less, and is particularly preferably from 4.0 μm or more to 10.0 μm or less.

The intermediate layer may include a layer comprised of α-type aluminum oxide (α-type $Al_2O_3$), and may or may not contain components other than α-type aluminum oxide (α-type $Al_2O_3$), as long as it provides the operation and effects of the present invention.

[Upper Layer]

The upper layer used in the present embodiment includes a TiCN layer containing TiCN. In the upper layer used in the present embodiment, as to a cross-sectional surface which is located within 1 μm below a surface of the upper layer toward the substrate and is parallel to a surface of the substrate, a misorientation B, being an angle formed by a normal to the cross-sectional surface and a normal to a (111) plane of a particle of a TiCN layer in the upper layer, satisfies a condition represented by formula (2) below;

$$RSB \geq 40 \quad (2)$$

(In the formula, RSB refers to a ratio (unit: area %) of the cross-sectional areas of particles, each of which has a misorientation B ranging from 0 degrees or more to below 10 degrees, to the cross-sectional areas of particles, each of which has a misorientation B ranging from 0 degrees or more to 45 degrees or less; and the misorientation B refers to an angle (unit: degrees) formed by a normal to the cross-sectional surface and a normal to a (111) plane of a particle of the TiCN layer in the upper layer.)

In the coated cutting tool of the present embodiment, the RSB is 40 area % or more, and this allows the falling of particles of the α-type $Al_2O_3$ layer to be suppressed, thereby leading to improvements of wear resistance and fracture resistance. From the same perspective, the RSB is preferably 50 area % or more (for example, from 50 area % or more to 70 area % or less), and is more preferably 60 area % or more.

RSB can be obtained by the method set forth below. As to a cross-sectional surface which is located within 1 μm below a surface of an upper layer toward a substrate and is parallel to a surface of the substrate, a total ($RSB_{Total}$) of the cross-sectional areas of particles, each of which has a misorientation B ranging from 0 degrees or more to 45 degrees or less, being an angle formed by a normal to the cross-sectional surface and a normal to a (111) plane of a particle in a TiCN layer in the upper layer, is defined as constituting 100 area %. Under such assumption, a ratio (area %) of a total of the cross-sectional areas of particles, each of which has a misorientation B ranging from 0 degrees or more to below 10 degrees, to $RSB_{Total}$ may be obtained, and the resulting ratio may be defined as RSB. When obtaining RSB (area %), the cross-sectional area of each particle can be measured using, for example, an electron backscatter diffraction pattern apparatus (EBSD) attached to a scanning electron microscope (SEM), a field emission scanning electron microscope (FE-SEM) or the like. With an EBSD, the crystal orientation of each crystal from among the particles is determined, and the cross-sectional area of the particle with the determined crystal orientation is classified into one of the divisions in, for example, respective 5-degree pitches, and the cross-sectional areas of the particles for each division are obtained. Thereafter, for instance, a total of the cross-sectional areas of particles is obtained for the following divisions: a division with a misorientation ranging from 0 degrees or more to below 10 degrees; a division with a misorientation ranging from 10 degrees or more to below 20 degrees; a division with a misorientation ranging from 20 degrees or more to below 30 degrees; and a division with a misorientation ranging from 30 degrees or more to 45 degrees or less. In this case, a total of the cross-sectional areas of particles, each of which has a misorientation ranging from 0 degrees or more to 45 degrees or less constitutes 100 area %. A ratio of the cross-sectional areas of particles for each of the above divisions to the $RSB_{Total}$ (100 area %) may be obtained, and the resulting ratio may be defined as RSB. It should be noted that the condition represented by formula (2) above is not necessarily required to be satisfied throughout the region located within 1 μm below the surface of the upper layer toward the substrate, and such condition is only required to be satisfied with respect to any cross-sectional surface located within the above range.

The average thickness of the upper layer used in the present embodiment is preferably from 1.0 μm or more to 6.0 μm or less. Such average thickness is 1.0 μm or more, and this indicates the tendency of the effect of suppressing the falling of particles of the α-type $Al_2O_3$ layer to be further improved, and the average thickness is 6.0 μm or less, and this indicates the tendency of the fracture resistance to be further improved. From the same perspective, the average thickness is more preferably from 1.5 μm or more to 5.0 μm or less.

The upper layer may include a layer containing TiCN, and may or may not contain components other than TiCN, as long as it provides the operation and effects of the present invention.

Examples of a method of forming layers that constitute a coating layer in a coated cutting tool according to the present embodiment include the method set forth below. However, such method of forming layers is not limited thereto.

For instance, a Ti compound layer, being comprised of a Ti nitride layer (hereinafter also referred to as a "TiN layer"), can be formed by chemical vapor deposition with a raw material composition of $TiCl_4$: from 5.0 mol % or more to 10.0 mol % or less, $N_2$: from 20 mol % or more to 60 mol % or less, and $H_2$: the balance, a temperature of from 850° C. or higher to 950° C. or lower, and a pressure of from 300 hPa or higher to 400 hPa or lower.

A Ti compound layer, being comprised of a Ti carbide layer (hereinafter also referred to as a "TiC layer"), can be formed by chemical vapor deposition with a raw material composition of $TiCl_4$: from 1.5 mol % or more to 3.5 mol % or less, $CH_4$: from 3.5 mol % or more to 5.5 mol % or less, and $H_2$: the balance, a temperature of from 950° C. or higher to 1,050° C. or lower, and a pressure of from 70 hPa or higher to 80 hPa or lower.

A Ti compound layer, being comprised of a Ti carbonitride layer (hereinafter also referred to as a "TiCN layer"), can be formed by chemical vapor deposition with a raw material composition of $TiCl_4$: from 5.0 mol % or more to 7.0 mol % or less, $CH_3CN$: from 0.5 mol % or more to 1.5 mol % or less, and $H_2$: the balance, a temperature of from 800° C. or higher to 900° C. or lower, and a pressure of from 60 hPa or higher to 80 hPa or lower.

A Ti compound layer, being comprised of a Ti carboxynitride layer (hereinafter also referred to as a "TiCNO layer"), can be formed by chemical vapor deposition with a raw material composition of $TiCl_4$: from 3.0 mol % or more to 4.0 mol % or less, CO: from 0.5 mol % or more to 1.0 mol % or less, $N_2$: from 30 mol % or more to 40 mol % or less, and $H_2$: the balance, a temperature of from 950° C. or higher to 1,050° C. or lower, and a pressure of from 50 hPa or higher to 150 hPa or lower.

A Ti compound layer, being comprised of a Ti carboxide layer (hereinafter also referred to as a "TiCO layer"), can be formed by chemical vapor deposition with a raw material composition of $TiCl_4$: from 1.0 mol % or more to 2.0 mol % or less, CO: from 2.0 mol % or more to 3.0 mol % or less, and $H_2$: the balance, a temperature of from 950° C. or higher to 1,050° C. or lower, and a pressure of from 50 hPa or higher to 150 hPa or lower.

An intermediate layer, being comprised of an α-type $Al_2O_3$ layer (hereinafter also simply referred to as an "$Al_2O_3$ layer"), can be obtained by, for example, the method set forth below.

Firstly, a lower layer, being comprised of one or more Ti compound layers, is formed on a surface of a substrate. Next, from among such layers, a surface of a layer which is most distant from the substrate is oxidized. Thereafter, a nucleus of an α-type $Al_2O_3$ layer is formed on the surface of the layer which is most distant from the substrate, and an α-type $Al_2O_3$ layer is then formed in the state in which such nucleus has been formed.

More specifically, the oxidation of the surface of the layer which is most distant from the substrate is performed under the conditions of a gas composition of CO: from 0.1 mol % or more to 0.3 mol % or less, $CO_2$: from 0.3 mol % or more to 1.0 mol % or less, and $H_2$: the balance, a temperature of from 950° C. or higher to 1,050° C. or lower, and a pressure of from 50 hPa or higher to 60 hPa or lower (an oxidation step). Here, the oxidation process time is preferably from 1 minutes or more to 3 minutes or less.

Thereafter, the nucleus of the α-type $Al_2O_3$ layer is formed by chemical vapor deposition with a raw material gas composition of $AlCl_3$: from 1.0 mol % or more to 4.0 mol % or less, CO: from 0.05 mol % or more to 2.0 mol % or less, $CO_2$: from 1.0 mol % or more to 3.0 mol % or less, HCl: from 2.0 mol % or more to 3.0 mol % or less, and $H_2$: the balance, a temperature of from 880° C. or higher to 930° C. or lower, and a pressure of from 60 hPa or higher to 80 hPa or lower (a nucleus formation step).

The α-type $Al_2O_3$ layer is then formed by chemical vapor deposition with a raw material gas composition of $AlCl_3$: from 2.0 mol % or more to 5.0 mol % or less, $CO_2$: from 2.5 mol % or more to 4.0 mol % or less, HCl: from 2.0 mol % or more to 3.0 mol % or less, $H_2S$: from 0.15 mol % or more to 0.25 mol % or less, and $H_2$: the balance, a temperature of from 950° C. or higher to 1,000° C. or lower, and a pressure of from 60 hPa or higher to 80 hPa or lower (a deposition step).

In order to achieve RSA (area %) having a specific value or more, the oxidation process time in the oxidation step may be controlled, the ratio of CO in the gas composition in the oxidation step and/or the nucleus formation step may be controlled, or the deposition temperature in the deposition step may be controlled. More specifically, the oxidation process time in the oxidation step may be increased, the ratio of CO in the gas composition in the oxidation step and/or the nucleus formation step may be increased, or the deposition temperature in the deposition step may be made higher than the nucleus formation temperature in the nucleus formation step, as a result of which the ratio (area %) of particles which each have an angle misorientation A falling within a specific range is increased, thereby leading to increased RSA.

Further, an upper layer, being comprised of a Ti carbonitride layer (hereinafter referred to as a "TiCN layer"), is formed on a surface of the α-type $Al_2O_3$ layer.

A TiCN layer can be formed by chemical vapor deposition with a raw material composition of $TiCl_4$: from 4.0 mol % or more to 8.0 mol % or less, $CH_3CN$: from 0.5 mol % or more to 2.0 mol % or less, $N_{2:\,0.0}$ mol % or more to 15.0 mol % or less, and $H_2$: the balance, a temperature of from 950° C. or higher to 1,050° C. or lower, and a pressure of from 60 hPa or higher to 80 hPa or lower (an upper layer formation step).

In order to achieve RSB (area %) having a specific value or more, in the upper layer formation step, the temperature may be controlled, or the ratio of $CH_3CN$ in the raw material composition may be controlled. More specifically, the temperature or the ratio of $CH_3CN$ in the raw material composition in the upper layer formation step may be increased, thereby leading to increased RSB (area %).

The thickness of each layer in the coating layer of the coated cutting tool of the present embodiment can be measured by observing a cross-sectional structure of the coated cutting tool, using an optical microscope, a scanning electron microscope (SEM), an FE-SEM, or the like. It should be noted that, as to the average thickness of each layer in the coated cutting tool of the present embodiment, such average thickness can be obtained by: measuring the thickness of each layer at three or more locations near the position 50 μm from the edge, toward the center of the rake surface of the coated cutting tool; and calculating the arithmetic mean of the resulting measurements. Further, the composition of each layer can be measured from a cross-sectional structure of the coated cutting tool of the present embodiment, using an energy-dispersive X-ray spectroscope (EDS), a wavelength-dispersive X-ray spectroscope (WDS), or the like.

EXAMPLES

Although the present invention will be described in further detail below, with examples, the present invention is not limited to such examples.

A cemented carbide cutting insert with a shape of JIS standard CNMA120412 and a composition of 88.7WC-8.0Co-1.5TiN-1.5NbC-0.3$Cr_3C_2$ (mass %) was prepared as a substrate. The edge of such substrate was subjected to round honing by means of an SiC brush, and the surface of the substrate was then washed.

[Invention Samples 1 to 13 and Comparative Samples 1 to 8]

After the substrate surface was washed, a coating layer was formed by chemical vapor deposition. Firstly, the substrate was inserted into an external heating chemical vapor deposition apparatus, and a first layer, whose composition is shown in Table 6, was formed on the substrate surface so as to have the average thickness shown in Table 6 under the raw material composition, temperature and pressure conditions shown in Table 1. Then, a second layer, whose composition is shown in Table 6, was formed on the surface of the first layer so as to have the average thickness shown in Table 6 under the raw material composition, temperature and pressure conditions shown in Table 1. Next, a third layer, whose composition is shown in Table 6, was formed on the surface of the second layer so as to have the average thickness shown in Table 6 under the raw material composition, temperature and pressure conditions shown in Table 1. As a result, a lower layer constituted by three layers was formed. Thereafter, the surface of the third layer was oxidized for the time shown in Table 2, under the composition, temperature and pressure conditions shown in Table 2. Then, a nucleus of α-type aluminum oxide (α-type $Al_2O_3$) was formed on the oxidized surface of the third layer under the raw material composition, temperature and pressure conditions shown in Table 3. Further, an intermediate layer (α-type $Al_2O_3$ layer), whose composition is shown in Table 6, was formed on the surface of the third layer and the surface of the nucleus of α-type aluminum oxide (α-type $Al_2O_3$) so as to have the average thickness shown in Table 6 under the raw material composition, temperature and pressure conditions shown in Table 4. Lastly, an upper layer, whose composition is shown in Table 6, was formed on the surface of the α-type $Al_2O_3$ layer so as to have the average thickness shown in Table 6 under the raw material composition, temperature and pressure conditions shown in Table 5. As a result, the coated cutting tools of invention samples 1 to 13 and comparative samples 1 to 8 were obtained.

The thickness of each layer of each of the samples was obtained as set forth below. That is, using an FE-SEM, the average thickness was obtained by: measuring the thickness of each layer, from each of the cross-sectional surfaces at three locations near the position 50 μm from the edge of the coated cutting tool, toward the center of the rake surface thereof; and calculating the arithmetic mean of the resulting measurements. Using an EDS, the composition of each layer of the obtained sample was measured from the cross-sectional surface near the position at most 50 μm from the edge of the coated cutting tool, toward the center of the rake surface thereof.

TABLE 1

| Each layer composition | Temperature (° C.) | Pressure (hPa) | Raw material composition (mol %) |
|---|---|---|---|
| TiN (First layer) | 900 | 350 | $TiCl_4$: 7.5%, $N_2$: 40.0%, $H_2$: 52.5% |
| TiC (First layer: invention sample 10) | 1,000 | 75 | $TiCl_4$: 2.4%, $CH_4$: 4.6%, $H_2$: 93.0% |
| TiCN (Second layer) | 850 | 70 | $TiCl_4$: 6.0%, $CH_3CN$: 1.0%, $H_2$: 93.0% |
| TiCNO (Third layer) | 1,000 | 100 | $TiCl_4$: 3.5%, CO: 0.7%, $N_2$: 35.5%, $H_2$: 60.3% |
| TiCO (Third layer: invention sample 11) | 1,000 | 80 | $TiCl_4$: 1.5%, CO: 2.5%, $H_2$: 96.0% |

TABLE 2

| | Oxidation step | | | | | |
|---|---|---|---|---|---|---|
| | Temperature (° C.) | Pressure (hPa) | Raw material composition (mol %) | | | Time (min) |
| | | | CO | $CO_2$ | $H_2$ | |
| Invention sample 1 | 1,000 | 55 | 0.3 | 0.5 | 99.2 | 2 |
| Invention sample 2 | 1,000 | 55 | 0.1 | 0.5 | 99.4 | 2 |

TABLE 2-continued

Oxidation step

| | Temperature (° C.) | Pressure (hPa) | Raw material composition (mol %) | | | Time (min) |
|---|---|---|---|---|---|---|
| | | | CO | $CO_2$ | $H_2$ | |
| Invention sample 3 | 1,000 | 55 | 0.3 | 0.5 | 99.2 | 3 |
| Invention sample 4 | 1,000 | 55 | 0.3 | 0.5 | 99.2 | 2 |
| Invention sample 5 | 1,000 | 55 | 0.3 | 0.5 | 99.2 | 2 |
| Invention sample 6 | 1,000 | 55 | 0.3 | 0.5 | 99.2 | 2 |
| Invention sample 7 | 1,000 | 55 | 0.3 | 0.5 | 99.2 | 2 |
| Invention sample 8 | 1,000 | 55 | 0.3 | 0.5 | 99.2 | 2 |
| Invention sample 9 | 1,000 | 55 | 0.3 | 0.5 | 99.2 | 2 |
| Invention sample 10 | 1,000 | 55 | 0.3 | 0.5 | 99.2 | 2 |
| Invention sample 11 | 1,000 | 55 | 0.3 | 0.5 | 99.2 | 2 |
| Invention sample 12 | 1,000 | 55 | 0.3 | 0.5 | 99.2 | 2 |
| Invention sample 13 | 1,000 | 55 | 0.3 | 0.5 | 99.2 | 2 |
| Comparative sample 1 | 1,000 | 55 | 0 | 0.5 | 99.5 | 1 |
| Comparative sample 2 | 1,000 | 55 | 0.3 | 0.5 | 99.2 | 2 |
| Comparative sample 3 | 1,000 | 55 | 0.3 | 0.5 | 99.2 | 2 |
| Comparative sample 4 | 1,000 | 55 | 0.3 | 0.5 | 99.2 | 2 |
| Comparative sample 5 | 1,000 | 55 | 0 | 0.5 | 99.5 | 1 |
| Comparative sample 6 | 1,000 | 55 | 0 | 0.5 | 99.5 | 1 |
| Comparative sample 7 | 1,000 | 55 | 0 | 0.5 | 99.5 | 1 |
| Comparative sample 8 | 1,000 | 55 | 0 | 0.5 | 99.5 | 1 |

TABLE 3

Intermediate layer (nucleus formation step)

| | Temperature (° C.) | Pressure (hPa) | Raw material composition (mol %) | | | | |
|---|---|---|---|---|---|---|---|
| | | | $AlCl_3$ | CO | $CO_2$ | HCl | $H_2$ |
| Invention sample 1 | 900 | 70 | 2.0 | 1.0 | 1.5 | 2.5 | 93.0 |
| Invention sample 2 | 920 | 70 | 2.5 | 0.5 | 2.0 | 2.5 | 92.5 |
| Invention sample 3 | 920 | 70 | 2.5 | 1.5 | 2.0 | 2.5 | 91.5 |
| Invention sample 4 | 900 | 70 | 2.0 | 1.0 | 1.5 | 2.5 | 93.0 |
| Invention sample 5 | 900 | 70 | 2.0 | 1.0 | 1.5 | 2.5 | 93.0 |
| Invention sample 6 | 900 | 70 | 2.0 | 1.0 | 1.5 | 2.5 | 93.0 |
| Invention sample 7 | 900 | 70 | 2.0 | 1.0 | 1.5 | 2.5 | 93.0 |
| Invention sample 8 | 900 | 70 | 2.0 | 1.0 | 1.5 | 2.5 | 93.0 |
| Invention sample 9 | 900 | 70 | 2.0 | 1.0 | 1.5 | 2.5 | 93.0 |
| Invention sample 10 | 900 | 70 | 2.0 | 1.0 | 1.5 | 2.5 | 93.0 |
| Invention sample 11 | 900 | 70 | 2.0 | 1.0 | 1.5 | 2.5 | 93.0 |
| Invention sample 12 | 900 | 70 | 2.0 | 1.0 | 1.5 | 2.5 | 93.0 |
| Invention sample 13 | 900 | 70 | 2.0 | 1.0 | 1.5 | 2.5 | 93.0 |
| Comparative sample 1 | 1,000 | 70 | 2.5 | 0.0 | 1.0 | 2.5 | 94.0 |
| Comparative sample 2 | 900 | 70 | 2.0 | 1.0 | 1.5 | 2.5 | 93.0 |
| Comparative sample 3 | 900 | 70 | 2.0 | 1.0 | 1.5 | 2.5 | 93.0 |
| Comparative sample 4 | 900 | 70 | 2.0 | 1.0 | 1.5 | 2.5 | 93.0 |
| Comparative sample 5 | 1,000 | 70 | 2.5 | 0.0 | 1.0 | 2.5 | 94.0 |
| Comparative sample 6 | 1,000 | 70 | 2.5 | 0.0 | 1.0 | 2.5 | 94.0 |
| Comparative sample 7 | 1,000 | 70 | 2.5 | 0.0 | 1.0 | 2.5 | 94.0 |
| Comparative sample 8 | 1,000 | 70 | 2.5 | 0.0 | 1.0 | 2.5 | 94.0 |

TABLE 4

Intermediate layer (deposition step)

| | Temperature (° C.) | Pressure (hPa) | Raw material composition (mol %) | | | | |
|---|---|---|---|---|---|---|---|
| | | | $AlCl_3$ | $CO_2$ | HCl | $H_2S$ | $H_2$ |
| Invention sample 1 | 990 | 70 | 3.0 | 3.0 | 2.5 | 0.20 | 91.3 |
| Invention sample 2 | 990 | 70 | 3.0 | 3.0 | 2.5 | 0.20 | 91.3 |
| Invention sample 3 | 990 | 70 | 3.0 | 3.0 | 2.5 | 0.20 | 91.3 |
| Invention sample 4 | 990 | 70 | 3.0 | 3.0 | 2.5 | 0.20 | 91.3 |
| Invention sample 5 | 990 | 70 | 3.0 | 3.0 | 2.5 | 0.20 | 91.3 |
| Invention sample 6 | 990 | 70 | 3.0 | 3.0 | 2.5 | 0.20 | 91.3 |
| Invention sample 7 | 990 | 70 | 3.0 | 3.0 | 2.5 | 0.20 | 91.3 |
| Invention sample 8 | 990 | 70 | 3.0 | 3.0 | 2.5 | 0.20 | 91.3 |
| Invention sample 9 | 990 | 70 | 3.0 | 3.0 | 2.5 | 0.20 | 91.3 |
| Invention sample 10 | 990 | 70 | 3.0 | 3.0 | 2.5 | 0.20 | 91.3 |
| Invention sample 11 | 990 | 70 | 3.0 | 3.0 | 2.5 | 0.20 | 91.3 |
| Invention sample 12 | 990 | 70 | 3.0 | 3.0 | 2.5 | 0.20 | 91.3 |
| Invention sample 13 | 990 | 70 | 3.0 | 3.0 | 2.5 | 0.20 | 91.3 |
| Comparative sample 1 | 990 | 70 | 3.0 | 3.0 | 2.5 | 0.20 | 91.3 |
| Comparative sample 2 | 990 | 70 | 3.0 | 3.0 | 2.5 | 0.20 | 91.3 |
| Comparative sample 3 | 990 | 70 | 3.0 | 3.0 | 2.5 | 0.20 | 91.3 |
| Comparative sample 4 | 990 | 70 | 3.0 | 3.0 | 2.5 | 0.20 | 91.3 |
| Comparative sample 5 | 990 | 70 | 3.0 | 3.0 | 2.5 | 0.20 | 91.3 |
| Comparative sample 6 | 990 | 70 | 3.0 | 3.0 | 2.5 | 0.20 | 91.3 |
| Comparative sample 7 | 990 | 70 | 3.0 | 3.0 | 2.5 | 0.20 | 91.3 |
| Comparative sample 8 | 990 | 70 | 3.0 | 3.0 | 2.5 | 0.20 | 91.3 |

TABLE 5

| | Upper layer | | | | | | |
|---|---|---|---|---|---|---|---|
| | Temperature (°C.) | Pressure (hPa) | Raw material composition (mol %) | | | | |
| | | | TiCl$_4$ | CH$_3$CN | CH$_4$ | N$_2$ | H$_2$ |
| Invention sample 1 | 1,000 | 70 | 6.0 | 1.0 | 0.0 | 5.0 | 88.0 |
| Invention sample 2 | 1,000 | 70 | 6.0 | 1.0 | 0.0 | 5.0 | 88.0 |
| Invention sample 3 | 1,000 | 70 | 6.0 | 1.0 | 0.0 | 5.0 | 88.0 |
| Invention sample 4 | 950 | 70 | 6.0 | 0.7 | 0.0 | 5.0 | 88.3 |
| Invention sample 5 | 1,050 | 70 | 6.0 | 2.0 | 0.0 | 5.0 | 87.0 |
| Invention sample 6 | 1,000 | 70 | 6.0 | 1.0 | 0.0 | 5.0 | 88.0 |
| Invention sample 7 | 1,000 | 70 | 6.0 | 1.0 | 0.0 | 5.0 | 88.0 |
| Invention sample 8 | 1,000 | 70 | 6.0 | 1.0 | 0.0 | 5.0 | 88.0 |
| Invention sample 9 | 1,000 | 70 | 6.0 | 1.0 | 0.0 | 5.0 | 88.0 |
| Invention sample 10 | 1,000 | 70 | 6.0 | 1.0 | 0.0 | 5.0 | 88.0 |
| Invention sample 11 | 1,000 | 70 | 6.0 | 1.0 | 0.0 | 5.0 | 88.0 |
| Invention sample 12 | 1,000 | 70 | 6.0 | 1.0 | 0.0 | 5.0 | 88.0 |
| Invention sample 13 | 1,000 | 70 | 6.0 | 1.0 | 0.0 | 5.0 | 88.0 |
| Comparative sample 1 | 1,000 | 70 | 6.0 | 1.0 | 0.0 | 5.0 | 88.0 |
| Comparative sample 2 | 1,000 | 70 | 6.0 | 0.0 | 1.5 | 15.0 | 77.5 |
| Comparative sample 3 | 1,000 | 70 | 6.0 | 1.0 | 0.0 | 5.0 | 88.0 |
| Comparative sample 4 | 1,000 | 350 | 7.5 | 0.0 | 0.0 | 40.0 | 52.5 |
| Comparative sample 5 | 1,000 | 70 | 6.0 | 0.0 | 1.5 | 15.0 | 77.5 |
| Comparative sample 6 | 1,000 | 70 | 6.0 | 0.0 | 1.5 | 15.0 | 77.5 |
| Comparative sample 7 | 1,000 | 70 | 6.0 | 0.0 | 1.5 | 15.0 | 77.5 |
| Comparative sample 8 | 1,000 | 70 | 6.0 | 0.0 | 1.5 | 15.0 | 77.5 |

TABLE 6

| | Coating layer Lower layer | | | | | | |
|---|---|---|---|---|---|---|---|
| | First layer | | Second layer | | Third layer | | Thickness of entire lower layer |
| Sample No. | Composition | Average thickness (μm) | Composition | Average thickness (μm) | Composition | Average thickness (μm) | |
| Invention sample 1 | TiN | 0.2 | TiCN | 6.0 | TiCNO | 0.3 | 6.5 |
| Invention sample 2 | TiN | 0.2 | TiCN | 6.0 | TiCNO | 0.3 | 6.5 |
| Invention sample 3 | TiN | 0.2 | TiCN | 6.0 | TiCNO | 0.3 | 6.5 |
| Invention sample 4 | TiN | 0.2 | TiCN | 6.0 | TiCNO | 0.3 | 6.5 |
| Invention sample 5 | TiN | 0.2 | TiCN | 6.0 | TiCNO | 0.3 | 6.5 |
| Invention sample 6 | TiN | 0.2 | TiCN | 6.0 | TiCNO | 0.3 | 6.5 |
| Invention sample 7 | TiN | 0.2 | TiCN | 6.0 | TiCNO | 0.3 | 6.5 |
| Invention sample 8 | TiN | 0.2 | TiCN | 6.0 | TiCNO | 0.3 | 6.5 |
| Invention sample 9 | TiN | 0.2 | TiCN | 9.0 | TiCNO | 0.3 | 9.5 |
| Invention sample 10 | TiC | 0.2 | TiCN | 6.0 | TiCNO | 0.3 | 6.5 |
| Invention sample 11 | TiN | 0.2 | TiCN | 6.0 | TiCO | 0.3 | 6.5 |
| Invention sample 12 | TiN | 0.2 | TiCN | 4.0 | TiCNO | 0.3 | 4.5 |
| Invention sample 13 | TiN | 0.2 | TiCN | 10.0 | TiCNO | 0.3 | 10.5 |
| Comparative sample 1 | TiN | 0.2 | TiCN | 6.0 | TiCNO | 0.3 | 6.5 |
| Comparative sample 2 | TiN | 0.2 | TiCN | 6.0 | TiCNO | 0.3 | 6.5 |
| Comparative sample 3 | TiN | 0.2 | TiCN | 15.0 | TiCNO | 0.3 | 15.5 |
| Comparative sample 4 | TiN | 0.2 | TiCN | 6.0 | TiCNO | 0.3 | 6.5 |
| Comparative sample 5 | TiN | 0.2 | TiCN | 6.0 | TiCNO | 0.3 | 6.5 |

TABLE 6-continued

| | | | | | | |
|---|---|---|---|---|---|---|
| Comparative sample 6 | TiN | 0.2 | TiCN | 6.0 | TiCNO | 0.3 | 6.5 |
| Comparative sample 7 | TiN | 0.2 | TiCN | 9.0 | TiCNO | 0.3 | 9.5 |
| Comparative sample 8 | TiN | 0.2 | TiCN | 4.0 | TiCNO | 0.3 | 4.5 |

| | Coating layer | | | | |
|---|---|---|---|---|---|
| | Intermediate layer | | | Upper layer | |
| Sample No. | Composition | Crystal system | Average thickness (μm) | Composition | Average thickness (μm) | Thickness of entire coating layer (μm) |
| Invention sample 1 | $Al_2O_3$ | α | 9.0 | TiCN | 2.0 | 17.5 |
| Invention sample 2 | $Al_2O_3$ | α | 9.0 | TiCN | 2.0 | 17.5 |
| Invention sample 3 | $Al_2O_3$ | α | 9.0 | TiCN | 2.0 | 17.5 |
| Invention sample 4 | $Al_2O_3$ | α | 9.0 | TiCN | 2.0 | 17.5 |
| Invention sample 5 | $Al_2O_3$ | α | 9.0 | TiCN | 2.0 | 17.5 |
| Invention sample 6 | $Al_2O_3$ | α | 9.0 | TiCN | 1.0 | 16.5 |
| Invention sample 7 | $Al_2O_3$ | α | 9.0 | TiCN | 4.0 | 19.5 |
| Invention sample 8 | $Al_2O_3$ | α | 9.0 | TiCN | 5.8 | 21.3 |
| Invention sample 9 | $Al_2O_3$ | α | 6.0 | TiCN | 2.0 | 17.5 |
| Invention sample 10 | $Al_2O_3$ | α | 9.0 | TiCN | 2.0 | 17.5 |
| Invention sample 11 | $Al_2O_3$ | α | 9.0 | TiCN | 2.0 | 17.5 |
| Invention sample 12 | $Al_2O_3$ | α | 4.0 | TiCN | 2.0 | 10.5 |
| Invention sample 13 | $Al_2O_3$ | α | 10.0 | TiCN | 2.0 | 22.5 |
| Comparative sample 1 | $Al_2O_3$ | α | 9.0 | TiCN | 2.0 | 17.5 |
| Comparative sample 2 | $Al_2O_3$ | α | 9.0 | TiCN | 2.0 | 17.5 |
| Comparative sample 3 | $Al_2O_3$ | α | 15.0 | TiCN | 2.0 | 32.5 |
| Comparative sample 4 | $Al_2O_3$ | α | 9.0 | TiN | 2.0 | 17.5 |
| Comparative sample 5 | $Al_2O_3$ | α | 9.0 | TiCN | 2.0 | 17.5 |
| Comparative sample 6 | $Al_2O_3$ | α | 9.0 | TiCN | 4.0 | 19.5 |
| Comparative sample 7 | $Al_2O_3$ | α | 6.0 | TiCN | 2.0 | 17.5 |
| Comparative sample 8 | $Al_2O_3$ | α | 4.0 | TiCN | 2.0 | 10.5 |

As to the intermediate layer of each of the obtained samples, an observation with an FE-SEM was conducted on a cross-sectional surface which is located within 0.5 μm below the surface of the intermediate layer toward the substrate and is parallel to the surface of the substrate, and a measurement was conducted, using an EBSD attached to the FE-SEM, so as to obtain a total ($RSA_{Total}$) of the cross-sectional areas of the particles of each layer, each having a misorientation A ranging from 0 degrees or more to 45 degrees or less. Then, the cross-sectional area of each of the particles, each having a misorientation A ranging from 0 degrees or more to 45 degrees or less, was classified into one of the divisions in respective 5-degree pitches, and the cross-sectional areas of the particles for each division were obtained. Next, a total of the cross-sectional areas of particles was obtained for the following divisions: a division with a misorientation A ranging from 0 degrees or more to below 10 degrees; a division with a misorientation A ranging from 10 degrees or more to below 20 degrees; a division with a misorientation A ranging from 20 degrees or more to below 30 degrees; and a division with a misorientation A ranging from 30 degrees or more to 45 degrees or less. A total of the cross-sectional areas of particles, each having a misorientation A ranging from 0 degrees or more to 45 degrees or less, constitutes 100 area %. With regard to the above divisions, a ratio of a total of the cross-sectional areas of particles for the division with a misorientation A ranging from 0 degrees or more to below 10 degrees to the $RSA_{Total}$ was defined as RSA. The measurement results are shown in Table 7 below. It should be noted that measurements with the EBSD were performed as follows. A sample was set on an FE-SEM. The sample was irradiated with an electron beam at an incident angle of 70 degrees as well as at an acceleration voltage of 15 kV and an irradiation current of 1.0 nA.

For a measurement range of 30 μm×50 μm, the misorientation of each particle and the cross-sectional area thereof were measured under the EBSD setting of a step size of 0.1 μm. The cross-sectional areas of particles of the intermediate layer in the measurement range were regarded as being served by a total sum of the pixels corresponding to such areas. That is, with regard to the particles of each layer, the total of the cross-sectional areas of particles for each of the divisions in respective 10 or 15-degree pitches according to the misorientation A was obtained by totaling the pixels occupied by the cross-sectional surfaces of the particles relating to each division and converting the resulting total into areas.

As to the upper layer of each of the obtained samples, an observation with an FE-SEM was conducted on a cross-sectional surface which is located within 0.5 μm below the surface of the upper layer toward the substrate and is parallel to the surface of the substrate, and a measurement was conducted, using an EBSD attached to the FE-SEM, so as to obtain a total ($RSB_{Total}$) of the cross-sectional areas of the particles of each layer, each having a misorientation B ranging from 0 degrees or more to 45 degrees or less. Then, the cross-sectional area of each of the particles, each having a misorientation B ranging from 0 degrees or more to 45 degrees or less, was classified into one of the divisions in respective 5-degree pitches, and the cross-sectional areas of the particles for each division were obtained. Next, a total of the cross-sectional areas of particles was obtained for the following divisions: a division with a misorientation B ranging from 0 degrees or more to below 10 degrees; a division with a misorientation B ranging from 10 degrees or more to below 20 degrees; a division with a misorientation B ranging from 20 degrees or more to below 30 degrees; and a division with a misorientation B ranging from 30 degrees or more to 45 degrees or less. A total of the cross-sectional areas of particles, each having a misorientation B ranging from 0 degrees or more to 45 degrees or less, constitutes 100 area %. With regard to the above divisions, a ratio of a total of the cross-sectional areas of particles for the division with a misorientation B ranging from 0 degrees or more to below 10 degrees to the $RSB_{Total}$ was defined as RSB. The measurement results are shown in Table 7 below. It should be noted that measurements with the EBSD were performed as follows. A sample was set on an FE-SEM. The sample was irradiated with an electron beam at an incident angle of 70 degrees as well as at an acceleration voltage of 15 kV and an irradiation current of 1.0 nA. For a measurement range of 30 μm×50 μm, the misorientation of each particle and the cross-sectional area thereof were measured under the EBSD setting of a step size of 0.1 μm. The cross-sectional areas of particles of the upper layer in the measurement range were regarded as being served by a total sum of the pixels corresponding to such areas. That is, with regard to the particles of each layer, the total of the cross-sectional areas of particles for each of the divisions in respective 10 or 15-degree pitches according to the misorientation B was obtained by totaling the pixels occupied by the cross-sectional surfaces of the particles relating to each division and converting the resulting total into areas.

TABLE 7

|  | Intermediate layer $RSA_{Total}$ (100 area %) | | | | Upper layer $RSB_{Total}$ (100 area %) | | | |
| --- | --- | --- | --- | --- | --- | --- | --- | --- |
|  | RSA 0° or more to below 10° | 10° or more to below 20° | 20° or more to below 30° | 30° or more to 45° or less | RSB 0° or more to below 100 | 10° or more to below 20° | 20° or more to below 30° | 30° or more to 45° or less |
| Invention sample 1 | 61 | 10 | 19 | 10 | 50 | 17 | 17 | 16 |
| Invention sample 2 | 42 | 18 | 21 | 19 | 49 | 19 | 17 | 15 |
| Invention sample 3 | 70 | 10 | 12 | 8 | 50 | 19 | 17 | 14 |
| Invention sample 4 | 60 | 12 | 19 | 9 | 41 | 21 | 20 | 18 |
| Invention sample 5 | 61 | 12 | 17 | 10 | 69 | 12 | 10 | 9 |
| Invention sample 6 | 60 | 10 | 19 | 11 | 49 | 16 | 18 | 17 |
| Invention sample 7 | 61 | 12 | 18 | 9 | 51 | 19 | 16 | 14 |
| Invention sample 8 | 61 | 14 | 17 | 8 | 51 | 18 | 15 | 16 |
| Invention sample 9 | 59 | 11 | 19 | 11 | 50 | 20 | 16 | 14 |
| Invention sample 10 | 61 | 11 | 19 | 9 | 51 | 16 | 16 | 17 |
| Invention sample 11 | 60 | 10 | 19 | 11 | 51 | 19 | 15 | 15 |
| Invention sample 12 | 59 | 12 | 20 | 9 | 49 | 14 | 18 | 19 |
| Invention sample 13 | 61 | 12 | 19 | 8 | 50 | 17 | 17 | 16 |
| Comparative sample 1 | 21 | 22 | 22 | 35 | 53 | 14 | 22 | 11 |
| Comparative sample 2 | 61 | 12 | 17 | 10 | 25 | 20 | 22 | 33 |
| Comparative sample 3 | 59 | 11 | 19 | 11 | 50 | 15 | 17 | 18 |
| Comparative sample 4 | 60 | 10 | 19 | 11 | 50 | 17 | 17 | 16 |

TABLE 7-continued

|  | Intermediate layer RSA$_{Total}$ (100 area %) | | | | Upper layer RSB$_{Total}$ (100 area %) | | | |
| --- | --- | --- | --- | --- | --- | --- | --- | --- |
|  | RSA 0° or more to below 10° | 10° or more to below 20° | 20° or more to below 30° | 30° or more to 45° or less | RSB 0° or more to below 100 | 10° or more to below 20° | 20° or more to below 30° | 30° or more to 45° or less |
| Comparative sample 5 | 20 | 24 | 22 | 34 | 25 | 20 | 22 | 33 |
| Comparative sample 6 | 23 | 20 | 21 | 36 | 27 | 19 | 23 | 31 |
| Comparative sample 7 | 21 | 20 | 24 | 35 | 24 | 19 | 22 | 35 |
| Comparative sample 8 | 22 | 24 | 24 | 30 | 26 | 21 | 20 | 33 |

Cutting tests 1 and 2 were conducted using the obtained samples, i.e., invention samples 1 to 13 and comparative samples 1 to 8, under the following conditions. Cutting test 1 is a wear test for evaluating wear resistance, and cutting test 2 is a fracture test for evaluating fracture resistance. The results of the respective cutting tests are shown in Table 8.

[Cutting Test 1]
Workpiece material: S45C round bar
Cutting speed: 230 m/min
Feed: 0.30 mm/rev
Depth of cut: 1.5 mm
Coolant: Used
Evaluation items: A time when a sample was fractured or had a maximum flank wear width of 0.2 mm was defined as the end of the tool life, and the machining time to reach the end of the tool life was measured. Further, the damage state after 15 minutes from the start of cutting was checked with an SEM.

[Cutting Test 2]
Workpiece material: S45C round bar with two grooves
Cutting speed: 150 m/min
Feed: 0.20 mm/rev
Depth of cut: 1.5 mm
Coolant: Used
Evaluation items: A time when a sample was fractured or had a maximum flank wear width of 0.2 mm was defined as the end of the tool life, and the number of shocks the sample had received until the end of the tool life was measured. Further, the damage state when the number of shocks reached 5,000 was checked with an SEM. The number of shocks was set at 15,000 at a maximum.

As to the machining time to reach the end of the tool life in cutting test 1 (wear test), evaluations were made with grade "A" for 40 minutes or more, grade "B" for 30 minutes or more and less than 40 minutes, and grade "C" for less than 30 minutes. Further, as to the number of shocks until the end of the tool life in cutting test 2 (fracture test), evaluations were made with grade "A" for 13,000 or more, grade "B" for 11,000 or more and 12,999 or less, and grade "C" for 10,999 or less. In such evaluations, "A" refers to excellent, "B" refers to good and "C" refers to inferior, meaning that a sample involving a larger number of "A"s or "B"s has more excellent cutting performance. The evaluation results are shown in Table 8.

TABLE 8

|  | Cutting test (1) | | | Cutting test (2) | | |
| --- | --- | --- | --- | --- | --- | --- |
|  | Damage state after a machining time of 15 minutes | Machining time (min) | Grade | Damage state after 5,000 shocks | Number of shocks (shocks) | Grade |
| Invention sample 1 | Normal wear | 44 | A | Normal wear | 14,500 | A |
| Invention sample 2 | Normal wear | 36 | B | Normal wear | 15,000 | A |
| Invention sample 3 | Normal wear | 47 | A | Normal wear | 14,200 | A |
| Invention sample 4 | Normal wear | 40 | A | Normal wear | 13,900 | A |
| Invention sample 5 | Normal wear | 47 | A | Normal wear | 15,000 | A |
| Invention sample 6 | Normal wear | 38 | B | Normal wear | 14,300 | A |
| Invention sample 7 | Normal wear | 49 | A | Normal wear | 13,800 | A |
| Invention sample 8 | Normal wear | 53 | A | Normal wear | 13,100 | A |
| Invention sample 9 | Normal wear | 40 | A | Normal wear | 14,400 | A |
| Invention sample 10 | Normal wear | 43 | A | Normal wear | 14,200 | A |
| Invention sample 11 | Normal wear | 44 | A | Normal wear | 14,000 | A |
| Invention sample 12 | Normal wear | 32 | B | Normal wear | 13,900 | A |

TABLE 8-continued

|  | Cutting test (1) | | | Cutting test (2) | | |
|---|---|---|---|---|---|---|
|  | Damage state after a machining time of 15 minutes | Machining time (min) | Grade | Damage state after 5,000 shocks | Number of shocks (shocks) | Grade |
| Invention sample 13 | Normal wear | 54 | A | Normal wear | 12,800 | B |
| Comparative sample 1 | Normal wear | 25 | C | Normal wear | 15,000 | A |
| Comparative sample 2 | Falling of $Al_2O_3$ particles | 29 | C | Chipping | 12,300 | B |
| Comparative sample 3 | Fracturing | 11 | C | Chipping | 8,500 | C |
| Comparative sample 4 | Falling of $Al_2O_3$ particles | 27 | C | Chipping | 10,400 | C |
| Comparative sample 5 | Falling of $Al_2O_3$ particles | 22 | C | Chipping | 12,800 | B |
| Comparative sample 6 | Falling of $Al_2O_3$ particles | 25 | C | Chipping | 11,600 | B |
| Comparative sample 7 | Falling of $Al_2O_3$ particles | 20 | C | Chipping | 12,700 | B |
| Comparative sample 8 | Falling of $Al_2O_3$ particles | 18 | C | Normal wear | 12,200 | B |

The results in Table 8 show that each invention sample had grade "A" or "B" in both the wear test and the fracture test. Meanwhile, as to the evaluations made on the comparative samples, each comparative sample had grade "C" in either or both of the wear test and the fracture test. In particular, in the wear test, each invention sample had grade "B" or higher while each comparative sample had grade "C." Accordingly, it is apparent that the wear resistance of each invention sample is more excellent than that of each comparative sample.

It is apparent from the above results that each invention sample has excellent wear resistance and fracture resistance, thereby resulting in a longer tool life.

INDUSTRIAL APPLICABILITY

The coated cutting tool according to the present invention has excellent wear resistance while not involving a reduction in fracture resistance so that the tool life can be extended more than that involved in the prior art, and from such perspective, the coated cutting tool has industrial applicability.

REFERENCE SIGNS LIST

1: Substrate, 2: Lower layer, 3: Intermediate layer, 4: Upper layer, 5: Coating layer, 6: Coated cutting tool.

What is claimed is:

1. A coated cutting tool comprising a substrate and a coating layer formed on a surface of the substrate, wherein:
   the coating layer comprises a lower layer including at least one Ti compound layer containing a Ti compound of Ti and an element of at least one kind selected from the group consisting of C, N, O and B, an intermediate layer including an α-type $Al_2O_3$ layer containing α-type $Al_2O_3$, and an upper layer including a TiCN layer containing TiCN;
   the respective layers are laminated in this order from the substrate side toward a surface side of the coating layer;
   an average thickness of the coating layer is from 5.0 μm or more to 30.0 μm or less;
   as to a cross-sectional surface which is located within 1 μm below a surface of the intermediate layer toward the substrate and is parallel to the surface of the substrate, a misorientation A satisfies a condition represented by formula (1) below; and
   as to a cross-sectional surface which is located within 1 μm below a surface of the upper layer toward the substrate and is parallel to the surface of the substrate, a misorientation B satisfies a condition represented by formula (2) below;

$$RSA \geq 40 \qquad (1)$$

(In the formula, RSA refers to a ratio (unit: area %) of the cross-sectional areas of particles, each of which has a misorientation A ranging from 0 degrees or more to below 10 degrees, to the cross-sectional areas of particles, each of which has a misorientation A ranging from 0 degrees or more to 45 degrees or less; and the misorientation A refers to an angle (unit: degrees) formed by a normal to the cross-sectional surface and a normal to a (001) plane of a particle of the α-type $Al_2O_3$ layer in the intermediate layer);

$$RSB \geq 40 \qquad (2)$$

(In the formula, RSB refers to a ratio (unit: area %) of the cross-sectional areas of particles, each of which has a misorientation B ranging from 0 degrees or more to below 10 degrees, to the cross-sectional areas of particles, each of which has a misorientation B ranging from 0 degrees or more to 45 degrees or less; and the misorientation B refers to an angle (unit: degrees) formed by a normal to the cross-sectional surface and a normal to a (111) plane of a particle of the TiCN layer in the upper layer).

2. The coated cutting tool according to claim 1, wherein the RSA is 50 area % or more.

3. The coated cutting tool according to claim 1, wherein the RSB is 50 area % or more.

4. The coated cutting tool according to claim 1, wherein an average thickness of the upper layer is from 1.0 μm or more to 6.0 μm or less.

5. The coated cutting tool according to claim 1, wherein an average thickness of the intermediate layer is from 3.0 μm or more to 15.0 μm or less.

6. The coated cutting tool according to claim 1, wherein an average thickness of the lower layer is from 3.0 μm or more to 15.0 μm or less.

7. The coated cutting tool according to claim 1, wherein the lower layer comprises a layer of at least one kind selected from the group consisting of a TiN layer containing TiN, a TiC layer containing TiC, a TiCN layer containing TiCN, a TiCNO layer containing TiCNO, a TiON layer containing TiON and a TiB$_2$ layer containing Ti B$_2$.

8. The coated cutting tool according to claim 1, wherein the substrate is a cemented carbide, cermet, ceramic or a cubic boron nitride sintered body.

9. The coated cutting tool according to claim 2, wherein the RSB is 50 area % or more.

10. The coated cutting tool according to claim 2, wherein an average thickness of the upper layer is from 1.0 μm or more to 6.0 μm or less.

11. The coated cutting tool according to claim 3, wherein an average thickness of the upper layer is from 1.0 μm or more to 6.0 μm or less.

12. The coated cutting tool according to claim 9, wherein an average thickness of the upper layer is from 1.0 μm or more to 6.0 μm or less.

13. The coated cutting tool according to claim 2, wherein an average thickness of the intermediate layer is from 3.0 μm or more to 15.0 μm or less.

14. The coated cutting tool according to claim 3, wherein an average thickness of the intermediate layer is from 3.0 μm or more to 15.0 μm or less.

15. The coated cutting tool according to claim 4, wherein an average thickness of the intermediate layer is from 3.0 μm or more to 15.0 μm or less.

16. The coated cutting tool according to claim 9, wherein an average thickness of the intermediate layer is from 3.0 μm or more to 15.0 μm or less.

17. The coated cutting tool according to claim 10, wherein an average thickness of the intermediate layer is from 3.0 μm or more to 15.0 μm or less.

18. The coated cutting tool according to claim 11, wherein an average thickness of the intermediate layer is from 3.0 μm or more to 15.0 μm or less.

19. The coated cutting tool according to claim 12, wherein an average thickness of the intermediate layer is from 3.0 μm or more to 15.0 μm or less.

20. The coated cutting tool according to claim 2, wherein an average thickness of the lower layer is from 3.0 μm or more to 15.0 μm or less.

* * * * *